United States Patent
Leu et al.

(10) Patent No.: US 6,489,200 B1
(45) Date of Patent: Dec. 3, 2002

(54) CAPACITOR FABRICATION PROCESS FOR ANALOG FLASH MEMORY DEVICES

(75) Inventors: Len-Yi Leu, Taiwan (CN); Chun-Mai Liu, San Jose, CA (US); Ken Su, San Jose, CA (US); Albert V. Kordesch, San Jose, CA (US)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 09/613,495

(22) Filed: Jul. 11, 2000

(51) Int. Cl.$^7$ .............................. H01L 21/336
(52) U.S. Cl. ................. 438/257; 438/264; 438/266; 438/259
(58) Field of Search ................... 438/257, 264, 438/266, 259, 262, 261, 791, 954, 787; 257/314, 68, 71, 315, 304, 307, 305, 316, 324

(56) References Cited

U.S. PATENT DOCUMENTS

| | | | |
|---|---|---|---|
| 5,218,511 A | 6/1993 | Nariani | 361/313 |
| 5,470,775 A | 11/1995 | Nariani | 437/52 |
| 5,693,971 A * | 12/1997 | Gonzalez | 257/314 |
| 5,707,897 A * | 1/1998 | Lee et al. | 438/257 |
| 5,801,415 A * | 9/1998 | Lee et al. | 257/316 |
| 5,903,026 A * | 5/1999 | Gonzalez | 257/315 |
| 5,981,404 A * | 11/1999 | Sheng et al. | 438/791 |
| 6,001,688 A | 12/1999 | Rizzuto | 438/264 |
| 6,015,984 A * | 1/2000 | Leu | 257/298 |
| 6,130,140 A * | 10/2000 | Gonzalez | 438/430 |
| 6,239,500 B1 * | 5/2001 | Sugimachi | 257/905 |

* cited by examiner

*Primary Examiner*—Olik Chaudhuri
*Assistant Examiner*—Laura M Schillinger
(74) *Attorney, Agent, or Firm*—Townsend and Townsend and Crew LLP

(57) ABSTRACT

A method of forming a capacitor on a substrate includes forming a first polysilicon layer overlying the substrate to define a floating gate. A second polysilicon overlying the first polysilicon layer is formed to define a control gate and a first electrode of the capacitor. A dielectric layer is formed over the second polysilicon layer. A third polysilicon layer is formed over the dielectric layer. The third polysilicon layer is etched to define a second electrode of the capacitor. Thereafter the dielectric layer is etched.

18 Claims, 4 Drawing Sheets

CAPACITOR FABRICATION PROCESS FOR ANALOG FLASH MEMORY DEVICES

BACKGROUND OF THE INVENTION

The present invention relates to a method of fabricating an integrated circuit, and more particularly, to a method of fabricating capacitors for analog flash memory devices.

Industry has used or proposed a variety of memory devices. An example of such a memory device is an erasable programmable read-only memory ("EPROM") device. The EPROM device is both readable, writable, and erasable, i.e., programmable. The EPROM is implemented using a floating gate field effect transistor, which has certain binary states. That is, a binary state is represented by the presence or absence of charge on the floating gate. The charge is generally sufficient to prevent conduction even when a normal high signal is applied to the gate of the EPROM transistor.

A wide variety of EPROMs is available. In a traditional form, EPROMs are programmed electrically and erased by exposure to ultraviolet light. These EPROMs are commonly referred to as ultraviolet erasable programmable read-only memories ("UVEPROM"s). UVEPROMs can be programmed by running a high current between a drain and a source of the UVEPROM transistor while applying a positive potential to the gate. The positive potential on the gate attracts energetic (i.e., hot) electrons from the drain-to-source current, where the electrons jump or inject into the floating gate and become trapped on the floating gate.

Another form of EPROM is the electrically erasable programmable read-only memory ("EEPROM" or "E2PROM"). EEPROMs are often programmed and erased electrically by way of a phenomenon known as Fowler-Nordheim tunneling. Still another form of EPROM is a "Flash EPROM," which is programmed using hot electrons and erased using the Fowler-Nordheim tunneling phenomenon. Flash EPROMs can be erased in a "flash" or bulk mode in which all cells in an array or a portion of an array can be erased simultaneously using Fowler-Nordheim tunneling, and are commonly called "Flash cells" or "Flash devices."

The flash memory devices generally include two polysilicon layers: a first polysilicon layer which defines a floating gate, and a second polysilicon layer which defines a control gate. The first polysilicon is lightly doped, and the second polysilicon is heavily doped. These polysilicon layers are appropriate for use as the electrodes of charge-storage capacitors since the lightly doped first polysilicon layer provides stable capacitance.

However, the lightly doped polysilicon layer is not suitable as an electrode of an analog capacitor because of its insufficient linearity. Analog circuits require linear analog capacitors for precision circuits such as switched capacitor filters, op-amps, and comparators. Such linear analog capacitors, therefore, require polysilicon layers which are highly doped as their electrodes. In addition, highly doped polysilicon layers are necessary to avoid the possible degradation of capacitor voltage coefficient due to the parasitic depletion of capacitance inside the polysilicon films. The voltage coefficient of the analog capacitors must be very low (on the order of 30 PPM/Volt) to reduce signal distortion to acceptable levels.

For these and other reasons, there is a need for an improved method of fabricating capacitors in an analog flash memory.

SUMMARY OF THE INVENTION

According to one embodiment of the present invention, a method of forming a capacitor on a substrate includes forming a first polysilicon layer overlying the substrate to define a floating gate. A second polysilicon overlying the first polysilicon layer is formed to define a control gate and a first electrode of the capacitor. A dielectric layer is formed over the second polysilicon layer. A third polysilicon layer is formed over the dielectric layer. The third polysilicon layer is etched to define a second electrode of the capacitor. Thereafter the dielectric layer is etched.

DESCRIPTION OF THE SPECIFIC EMBODIMENTS

Figure 1:
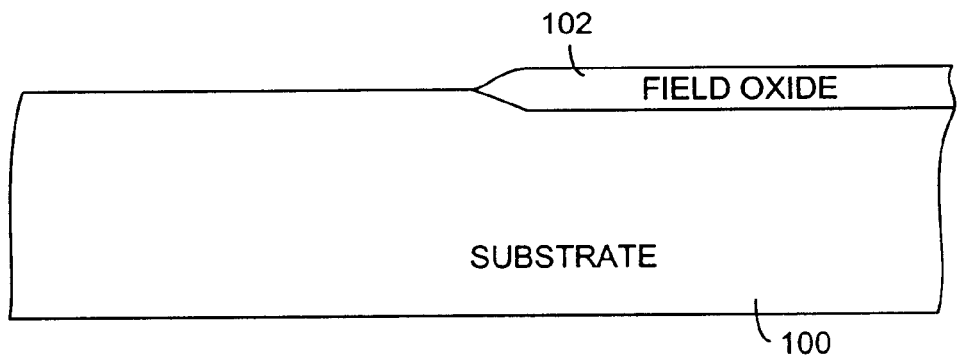
FIGS. 1–7 illustrate a method of fabricating a capacitor on a substrate according to embodiments of the present invention.

Referring to FIG. 1, according to one embodiment of the present invention, fabrication of a flash memory device begins with forming a field oxide region 102 on a substrate, e.g., silicon wafer. The formation of field oxide region 102 includes growing a layer of thermal oxide or pad oxide (not shown) over the surface of substrate 100. A masking layer (not shown), frequently composed of nitride, is deposited on the pad oxide and patterned to expose a portion of the pad oxide. Afterwards, at the exposed areas, field oxide 102 is grown to a thickness of about 6,500 Å. The field oxide region provides electrical isolation between the various active regions of the flash memory device. After growing field oxide 102, the masking layer and pad oxide are stripped to expose the underlying substrate 100.

Figure 2:
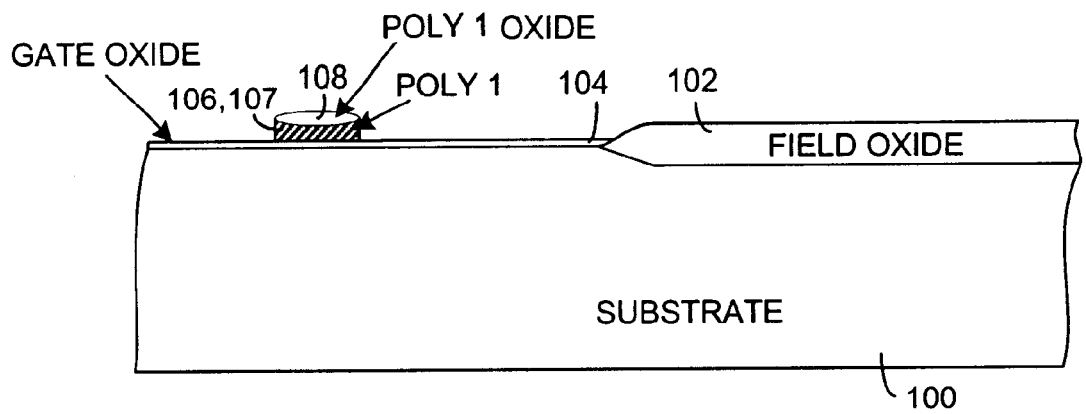

Referring to FIG. 2, a thin oxide or gate oxide layer 104 is formed over the substrate using a thermal growth process in a dry oxidation furnace. The gate oxide layer generally has a thickness of about 50–150 Angstroms. A first polysilicon layer 106 having a thickness of about 500–1,000 Å is deposited on the gate oxide. The first polysilicon layer is subsequently etched to define a floating gate 107, as explained later. Generally, the first polysilicon layer is deposited using a low pressure chemical vapor deposition ("LPCVD") process and is lightly doped. The methods used to dope the first polysilicon includes diffusion doping, in-situ doping, and ion implantation doping techniques. The polysilicon layer is doped with n-type dopants to a concentration level of about $1 \times 10^{19}$ dopants per cubic centimeter. At this dopant concentration, the polycrystalline is not conductive enough to be used as an electrode of an analog capacitor. Typically, a polysilicon layer suitable for use in analog capacitors requires to be doped at a concentration of $1 \times 10^{21}$ dopants per cubic centimeter or higher.

Thereafter, first polysilicon layer 106 is etched to define a floating gate. The step includes forming a masking layer (not shown) over the first polysilicon layer, patterning the mask layer to expose the unwanted portions of the first polysilicon layer, and removing the exposed portions of the first polysilicon layer using a dry etch method such as a reactive ion etching process ("RIE") using a plasma ignited from a gas mixture of HBr and $O_2$ or HBr, $Cl_2$ and $O_2$. The first polysilicon layer 106 left on the pad oxide the etch step defines the floating gate.

An interpoly dielectric layer 108 is then formed over the first polysilicon layer and the substrate. Layer 108 is often called the interpoly dielectric film since it is sandwiched between the first polysilicon layer and another polysilicon layer which defines the control gate for each cell, as explained later. The interpoly dielectric layer can be a silicon oxide or an ONO layer having a thickness of about 150–400 Å, where the ONO layer has oxide, nitride, and oxide layers stacked in sequence. A masking layer (not shown) is deposited over the dielectric layer and patterned to expose the dielectric layer not directly over the first polysilicon layer. The exposed dielectric layer is etched to shape the dielectric layer 108 as shown in FIG. 2. The etching is generally anisotropic which etches substantially in vertical direction. This technique can be plasma etching, reactive ion etching, and other processes.

Alternatively, the interpoly dielectric layer 108 may be shaped, as in FIG. 2, by depositing a masking layer over the first polysilicon layer and patterning the masking layer to expose only the top surface of the first polysilicon layer. The dielectric layer is deposited on the exposed surface of the first polysilicon layer. Thereafter, the masking layer is removed. Yet in other embodiments, other methods may be used to form the floating gate and the shaped interpoly dielectric layer.

Figure 3:
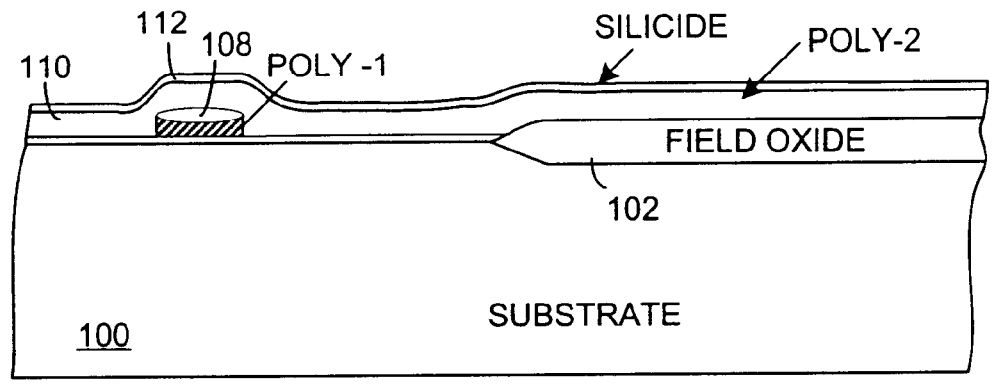

Referring to FIG. 3, after the formation of interpoly dielectric layer 108, a second polysilicon layer 110 having a thickness of about 1000–2000 Å, generally about 1500, is deposited over the dielectric layer and the substrate using one of many techniques. Generally, the second polysilicon layer is deposited using a LPCVD process and is heavily doped in contrast to the first polysilicon layer. The methods used to dope the first polysilicon include diffusion doping, in-situ doping, and ion implantation doping techniques. In one embodiment, second polysilicon layer 110 is doped with n-type dopants to a concentration level of about $1 \times 10^{21}$ dopants per cubic centimeter, thereby making the layer sufficiently conductive to be used in the analog capacitor. Therefore, the second polysilicon layer is used to define both the control gate and the bottom electrode of an analog capacitor.

In some embodiments, the polysilicon layer is defined at low temperature in an amorphous state and later crystallized. Alternatively, the polysilicon layer is formed in the polycrystalline state from the beginning. A metal layer (not shown) is deposited over polysilicon layer 110 and annealed to form a silicide layer 112 thereon. The metal deposited can be tungsten, titanium, molybdenum, chromium, nickel, cobalt, tantalum, and the like. The silicide layer provides a lower contact resistance for improved flash memory cell performance.

Figure 4:
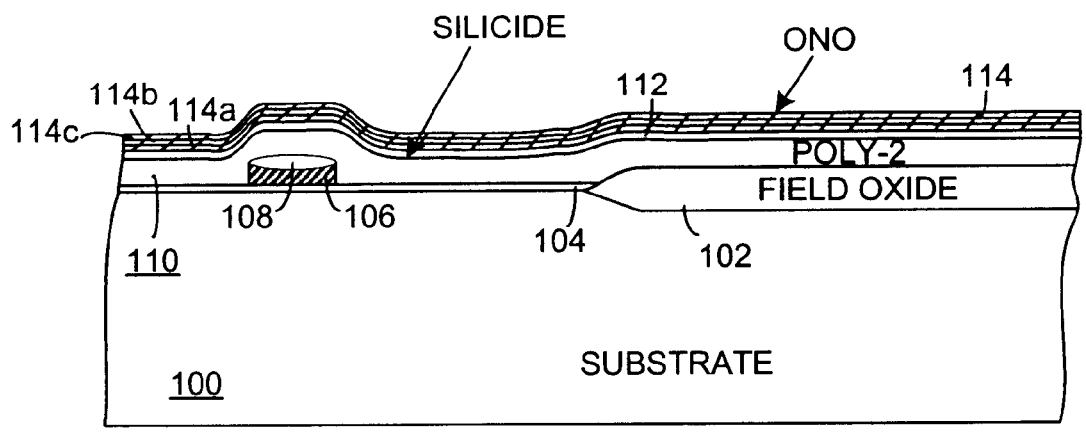

An insulating layer 114, generally an ONO layer, is formed overlying the silicide layer, as shown in FIG. 4. The ONO layer has a thickness of about 230–500 Å, preferably about 350 Å. In particular, the a first oxide layer 114a of about 80–150 Å, preferably about 120 Å, is deposited overlying the silicide layer. A nitride layer 114b of about 100–200 Å, preferably about 150 Å, is deposited overlying the oxide layer. A second oxide layer 114c of about 50–150 Å, preferably about 80 Å, is deposited overlying the nitride layer. In one embodiment, the ONO layer is provided with a thickness sufficient to withstand 15 volts for about 10 years.

The present inventors have unexpectedly discovered that it is preferable to form the first oxide layer to be thicker than the second oxide layer to obtain substantially symmetrical positive and negative breakdown voltages of the ONO layer. In other words, contrary to expectation, ONO layer 114 having first and second oxide layers 114a and 114c having substantially the same thickness experienced breakdown voltage at asymmetrical positive and negative voltages. For example, ONO layer 114 having the first oxide layer with a thickness of 100 Å, the nitride layer with a thickness of 150 Å, and the second oxide layer with a thickness of 100 Å experienced voltage breakdowns at positive 12 volts and negative 17 volts. However, ONO layer 114 having the first oxide layer with a thickness of 120 Å, the nitride layer with a thickness of 150 Å, and the second oxide layer with a thickness of 80 Å experienced voltage breakdowns at positive 15 volts and negative 15 volts, providing substantially symmetrical breakdown voltages. As used herein, the substantially symmetrical breakdown voltages refers to a situation where the positive breakdown voltage and the negative breakdown voltage are within ±2 voltages from each other. In one implementation, the first oxide layer is preferably about 40–60 percent thicker than the second oxide to obtain substantially symmetrical breakdown voltages.

Figure 5:
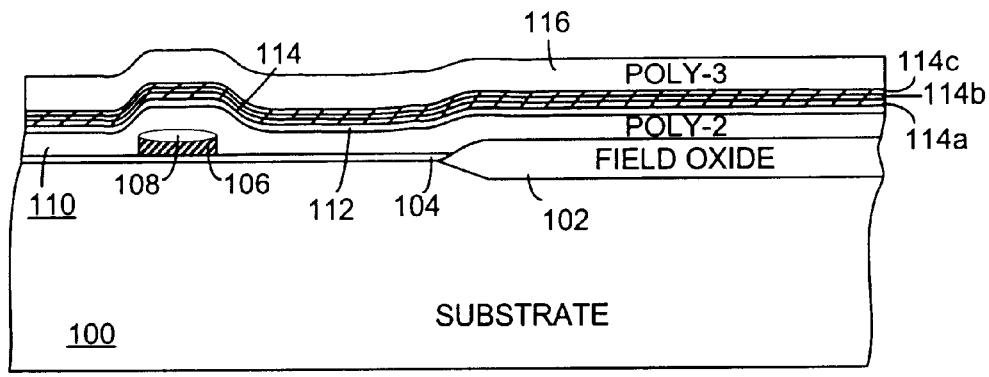

Referring to FIG. 5, a third polysilicon layer 116 having a thickness of about 2000–3000 Å is formed overlying ONO layer 114 using one of many techniques. Generally, the third polysilicon layer is deposited using an LPCVD process and heavily doped as with the second polysilicon layer. In some embodiments, the polysilicon layer is defined at low temperature in an amorphous state and later crystallized. Alternatively, the polysilicon layer is formed in the polycrystalline state from the beginning. The methods used to dope the polysilicon layer include diffusion doping, in-situ doping, and ion implantation doping techniques. In one embodiment, third polysilicon layer 116 is doped with n-type dopants to a concentration level of about $1 \times 10^{21}$ dopants per cubic centimeter, thereby making the layer sufficiently conductive to be used in the analog capacitor. The third polysilicon layer is used to define the top electrode of an analog capacitor.

Figure 6:
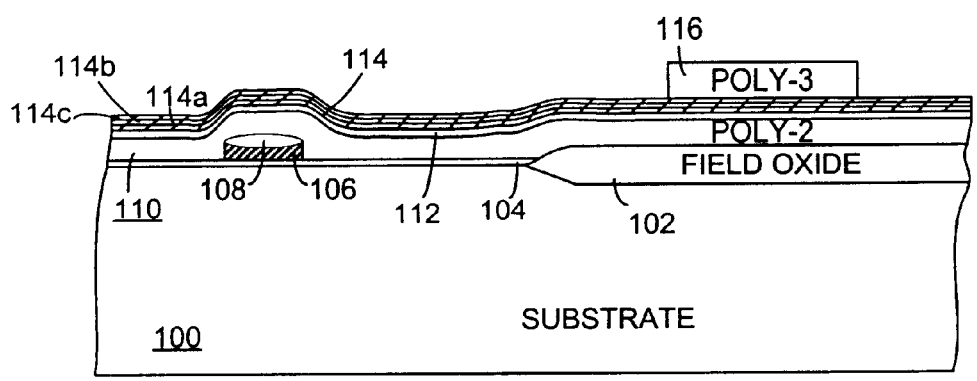

As shown in FIG. 6, third polysilicon layer 116 is etched to define the top electrode of an analog capacitor. The step includes forming a masking layer (not shown) over the polysilicon layer, patterning the mask layer to expose the unwanted portions of the third polysilicon layer, and removing the exposed portions of the polysilicon layer using a dry etch method such as a reactive ion etching process ("RIE") using a plasma ignited from a gas mixture of HBr and $O_2$ or HBr, $Cl_2$ and $O_2$. The polysilicon layer left on ONO layer 114 after the etch step defines a top electrode 117 of an analog capacitor 120.

Figure 7:
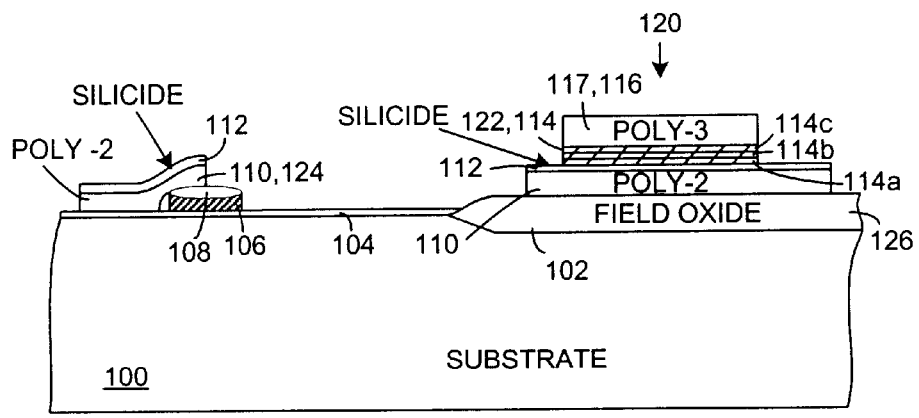

Thereafter, the exposed ONO layer is etched using techniques such as plasma etching, reactive ion etching and other anisotropic etching processes. As a result, only ONO layer 114 directly below the third polysilicon layer remains to define a dielectric layer 122 of capacitor 120 (FIG. 7). Similarly, a masking layer (not shown) is deposited over the second polysilicon layer and patterned to expose unwanted portions of the polysilicon layer. The exposed polysilicon layer is etched using techniques such as plasma etching, reactive ion etching and other anisotropic etching processes. As a result, the second polysilicon layer is shaped to define a control gate 124 overlying the floating gate, i.e., the first polysilicon layer, and a bottom electrode 126 of the analog capacitor.

Figure 8:
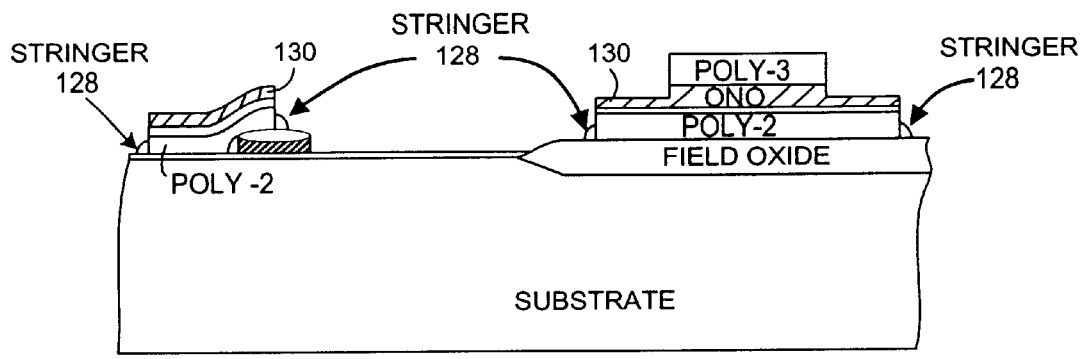
FIG. 8 illustrates a simplified diagram of a substrate where an ONO layer is etched before the third polysilicon layer.

The present inventors have discovered that the above sequence of steps, i.e., etching third polysilicon layer 116 before poly layer 110, provides an unexpected benefit of reducing or preventing formation of poly stringers 128, i.e., poly residue from an etch step (see, FIG. 8). Poly stringers 120 are formed generally below the ends of the etched ONO layer 114, as shown in FIG. 8. Stringers 120 result from imperfect anisotropic etching of the polysilicon layer since etch processes generally cannot form perfectly vertical structures.

If an alternative sequence of steps is used to fabricate the analog capacitor, significant amounts of stringers 128 would appear, as shown in FIG. 8. The alternative sequence of steps involves first etching the second polysilicon layer, depositing the ONO layer, and then depositing the third polysilicon layer. The deposited third polysilicon layer is masked and etched. Subsequently, the ONO layer is etched without removing the mask, to the same pattern. In this etch the first two layers of the ONO layer, i.e, oxide and nitride layers, are etched leaving only an oxide layer 130 on selected portions of the second polysilicon layer.

While the above is a full description of the specific embodiments, various modifications, alternative constructions and equivalents may be used. For example, specific dimensions discussed above are for the specific embodiments. These dimensions may depend on the particular application. Therefore, the above description and illustrations should not be taken as limiting the scope of the present invention which is defined by the appended claims.

What is claimed is:

1. A method of forming a capacitor on a substrate, comprising:

forming a first polysilicon layer overlying the substrate to define a floating gate;

forming a second polysilicon layer overlying the first polysilicon layer to define a control gate and a first electrode of the capacitor;

forming a dielectric layer over the second polysilicon layer;

forming a third polysilicon layer over the dielectric layer;

etching the third polysilicon layer to define a second electrode of the capacitor; and thereafter etching the dielectric layer.

2. The method of claim 1, wherein the dielectric layer is an ONO layer.

3. The method of claim 2, wherein the ONO layer has a first oxide film with a first thickness, a second oxide film with a second thickness, and a nitride film with a third thickness, where the first thickness and the second thickness are not the same.

4. The method of claim 3, wherein first oxide film overlies the second polysilicon layer and the second oxide film overlies the first oxide film, where the first thickness of the first oxide film is greater than the second thickness of the second oxide film.

5. The method of claim 4, wherein the first thickness is about 40 percent to about 60 percent thicker than the second thickness.

6. The method of claim 3, wherein the first oxide film is about 80 Å to about 150 Å, the second oxide film is about 50 Å to about 150 Å, and the nitride film is about 100 Å to about 200 Å.

7. The method of claim 1, wherein the breakdown voltage of the dielectric layer is substantially symmetrical.

8. The method of claim 1, further comprising:

etching the second polysilicon layer after etching the third polysilicon layer.

9. The method of claim 8, wherein the second polysilicon layer is etched after the dielectric layer has been etched.

10. The method of claim 9, wherein the dielectric layer is etched after the third polysilicon layer, and the second polysilicon layer is etched after the dielectric layer, so that residue stringers present on the sides of the etched second polysilicon layer are reduced.

11. The method of claim 1, wherein the capacitor is configured to operate in an analog environment.

12. A method of forming an analog capacitor on a substrate, comprising:

forming a first polysilicon layer overlying the substrate to define a floating gate;

forming a second polysilicon overlying the first polysilicon layer;

forming an ONO layer over the second polysilicon layer;

forming a third polysilicon layer over the ONO layer;

etching the third polysilicon layer to define a top electrode of the capacitor;

thereafter etching the ONO layer; and etching the second polysilicon layer to define a control gate and a bottom electrode of the capacitor.

13. The method of claim 12, wherein the ONO layer has a first oxide film and a second oxide film, where the first and second oxide films have different thickness.

14. The method of claim 12, wherein the ONO layer has a symmetrical breakdown voltage.

15. The method of claim 14, wherein the ONO layer has a positive breakdown voltage of about +15 volts and a negative breakdown of −15 volts.

16. The method of claims 12, wherein the second polysilicon layer is etched after the ONO layer has been etched.

17. A method of forming an analog capacitor and a flash memory cell on a substrate, comprising:

forming a first polysilicon layer overlying the substrate to define a floating gate, the first polysilicon layer having a dopant concentration level appropriate for a floating gate but inappropriate for an electrode of an analog capacitor;

forming a second polysilicon layer overlying the first polysilicon layer, the second polysilicon layer having a dopant concentration level appropriate for an electrode of an analog capacitor;

forming an ONO layer over the second polysilicon layer;

forming a third polysilicon layer over the ONO layer; the third polysilicon layer having a dopant concentration level appropriate for an electrode of an analog capacitor etching the third polysilicon layer to define a top electrode of the capacitor;

thereafter etching the ONO layer to define a dielectric layer of the capacitor; and etching the second polysilicon layer to define a control gate and a bottom electrode of the capacitor.

18. The method of claim 17, wherein the second polysilicon layer is etched after the ONO layer has been etched.

* * * * *